United States Patent
Higashizawa et al.

(10) Patent No.: US 9,761,556 B2
(45) Date of Patent: Sep. 12, 2017

(54) METHOD OF MANUFACTURING ELECTRONIC DEVICE

(71) Applicant: SHINKO ELECTRIC INDUSTRIES CO., LTD., Nagano-shi, Nagano (JP)

(72) Inventors: Yoshitada Higashizawa, Nagano (JP); Kosuke Kobayashi, Nagano (JP); Yukinori Hatayama, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 26 days.

(21) Appl. No.: 14/883,111

(22) Filed: Oct. 14, 2015

(65) Prior Publication Data

US 2016/0035694 A1 Feb. 4, 2016

Related U.S. Application Data

(62) Division of application No. 13/868,413, filed on Apr. 23, 2013, now Pat. No. 9,210,836.

(30) Foreign Application Priority Data

May 1, 2012 (JP) ................................. 2012-104343

(51) Int. Cl.
*H05K 13/04* (2006.01)
*H01L 23/00* (2006.01)
(Continued)

(52) U.S. Cl.
CPC ............ *H01L 24/81* (2013.01); *B23K 1/0004* (2013.01); *B23K 1/008* (2013.01); *B23K 1/0008* (2013.01);
(Continued)

(58) Field of Classification Search
CPC ..... H01L 2224/812; H01L 2224/81203; H01L 2224/81801; H01L 2224/81815;
(Continued)

(56) References Cited

U.S. PATENT DOCUMENTS 4,775,776 A 10/1988 Rahn et al.
6,926,796 B1 8/2005 Nishida
(Continued)

FOREIGN PATENT DOCUMENTS

EP 1655777 A1 5/2006
JP 06-37149 A 2/1994
(Continued)

OTHER PUBLICATIONS

Search Report issued Jul. 10, 2014 by the Intellectual Property Office of Singapore in counterpart application No. 2013029657.
(Continued)

*Primary Examiner* — Minh Trinh
(74) *Attorney, Agent, or Firm* — Kratz, Quintos & Hanson, LLP

(57) ABSTRACT

An electronic component mounting device, includes a stage in which a plurality of stage portions are defined, a first heater provided in the plurality of stage portions respectively, and the first heater which can be controlled independently, a mounting head arranged over the stage, and a second heater provided in the mounting head.

1 Claim, 12 Drawing Sheets

(51) Int. Cl.
*H05K 13/00* (2006.01)
*H05K 3/34* (2006.01)
*B23K 1/00* (2006.01)
*B23K 1/20* (2006.01)
*B23K 3/08* (2006.01)
*H01L 21/56* (2006.01)
*B23K 1/008* (2006.01)
*B23K 101/42* (2006.01)

(52) U.S. Cl.
CPC ............ *B23K 1/0016* (2013.01); *B23K 1/203* (2013.01); *B23K 3/082* (2013.01); *H01L 21/561* (2013.01); *H01L 24/75* (2013.01); *H01L 24/97* (2013.01); *H05K 3/3494* (2013.01); *H05K 13/0061* (2013.01); *H05K 13/04* (2013.01); *H05K 13/0465* (2013.01); *B23K 2201/42* (2013.01); *H01L 2224/13111* (2013.01); *H01L 2224/16235* (2013.01); *H01L 2224/32225* (2013.01); *H01L 2224/73204* (2013.01); *H01L 2224/7501* (2013.01); *H01L 2224/7565* (2013.01); *H01L 2224/7598* (2013.01); *H01L 2224/75251* (2013.01); *H01L 2224/75252* (2013.01); *H01L 2224/75753* (2013.01); *H01L 2224/75841* (2013.01); *H01L 2224/812* (2013.01); *H01L 2224/81011* (2013.01); *H01L 2224/8113* (2013.01); *H01L 2224/81024* (2013.01); *H01L 2224/81097* (2013.01); *H01L 2224/81098* (2013.01); *H01L 2224/81191* (2013.01); *H01L 2224/81203* (2013.01); *H01L 2224/81801* (2013.01); *H01L 2224/81815* (2013.01); *H01L 2224/81986* (2013.01); *H01L 2224/83* (2013.01); *H01L 2224/83104* (2013.01); *H01L 2224/97* (2013.01); *H01L 2924/181* (2013.01); *H01L 2924/351* (2013.01); *H05K 2201/10515* (2013.01); *H05K 2201/10674* (2013.01); *H05K 2203/047* (2013.01); *H05K 2203/1115* (2013.01); *Y10T 29/4913* (2015.01); *Y10T 29/53174* (2015.01)

(58) Field of Classification Search
CPC ....... H01L 2224/81986; H01L 2224/83; H01L 24/75; H01L 24/81; H01L 24/97; A61B 1/0055; A61B 1/0057; B23K 1/0004
See application file for complete search history.

(56) References Cited

U.S. PATENT DOCUMENTS

| 7,526,858 | B2 | 5/2009 | Kasuga et al. |
| 7,650,687 | B2 | 1/2010 | Woo et al. |
| 7,683,482 | B2 | 3/2010 | Nishida |
| 8,007,627 | B2 | 8/2011 | Nishida |
| 8,925,188 | B2 | 1/2015 | Nishino et al. |
| 9,210,836 | B2 * | 12/2015 | Higashizawa ......... H05K 13/04 |
| 2004/0137708 | A1 | 7/2004 | Shibata |
| 2005/0011068 | A1 | 1/2005 | Yuzawa |
| 2005/0224974 | A1 | 10/2005 | Nishida |
| 2007/0013067 | A1 | 1/2007 | Nishida et al. |
| 2013/0291378 | A1 | 11/2013 | Higashizawa et al. |
| 2016/0035694 | A1 * | 2/2016 | Higashizawa ......... H05K 13/04 219/148 |

FOREIGN PATENT DOCUMENTS

| JP | 2844409 | B2 | 1/1999 |
| JP | 11-186338 | A | 7/1999 |
| JP | 11-274227 | A | 10/1999 |
| JP | 2001-351949 | A | 12/2001 |
| JP | 2002-118149 | A | 4/2002 |
| JP | 2002-151553 | A | 5/2002 |
| JP | 3309709 | B2 | 7/2002 |
| JP | 3475801 | B2 | 12/2003 |
| JP | 2007-258483 | A | 10/2007 |
| JP | 2007-288228 | A1 | 11/2007 |
| JP | 2010-245195 | A | 10/2010 |

OTHER PUBLICATIONS

Japanese Notification, for the Corresponding JP Application No. 2012-104343, dated May 19, 2015, with translation.

* cited by examiner

METHOD OF MANUFACTURING ELECTRONIC DEVICE

CROSS-REFERENCE TO RELATED APPLICATIONS

This application is a divisional of U.S. application Ser. No. 13/868,413, filed Apr. 23, 2013, which issued as U.S. Pat. No. 9,210,836, on Dec. 8, 2015, which is based upon and claims the benefit of priority of the prior Japanese Patent Application No. 2012-104343, filed on May 1, 2012, which issued as Japanese Patent No. 6,000,626, on Sep. 9, 2016, the entire contents of all both of which are incorporated herein by reference in their entirety.

FIELD

It is related to a method of manufacturing an electronic device, and an electronic component mounting device.

BACKGROUND

With development of electronic devices in recent years, size reduction, higher performance, and the like are demanded in the semiconductor device employed in the electronic devices. In order to respond to the demands, the semiconductor device which has such a structure that semiconductor chips, etc. are stacked have already been put in practical use.

In one example of such semiconductor devices, the upper wiring substrate having the solder electrodes is arranged on the lower wiring substrate on which the semiconductor chip is mounted, and then both the lower wiring substrate and the upper wiring substrate are connected electrically via the solder electrodes by the reflow heating.

A related art is disclosed in Japanese Laid-open Patent Publication No. 2007-288228.

As explained in the column of the preliminary matter described later, in the electronic device manufacturing methods, there is a method that a plurality of upper substrates are soldered onto a plane of a sheet of lower substrate by sequentially applying the reflow heating. In this method, when the second upper substrate is connected to the lower substrate, in order to prevent such an event that solder electrodes of the first upper substrate which is already mounted are reflowed again, it is necessary that a temperature of the stage is set considerably lower than a reflow temperature.

Owing to this temperature difference, strong thermal stress is caused between the lower substrate and the upper substrate by a difference of thermal expansion. As a result, there exist such problems that warping of the substrate is ready to occur, and that sufficient reliability of the electrical connection cannot be obtained.

SUMMARY

According to one aspect discussed herein, there is provided an electronic component mounting device, which includes, a stage in which a plurality of stage portions are defined, a first heater provided in the plurality of stage portions respectively, and which can be controlled independently, a mounting head arranged over the stage, and a second heater provided in the mounting head.

Also, according to another aspect discussed herein, there is provided a method of manufacturing an electronic device, which includes preparing an electronic component mounting device which includes, a stage in which a plurality of stage portions are defined, a first heater provided in the plurality of stage portions respectively, and which can be controlled independently, a mounting head arranged over the stage, and a second heater provided in the mounting head, arranging an electronic component structure on the stage, and fixing a first electronic component to the mounting head, arranging the first electronic component fixed to the mounting head, on the electronic component structure on a first stage portion, heating the electronic component structure and the first electronic component by the first heater of the first stage portion and the second heater of the mounting head at a first temperature, and then cooling to a second temperature which is lower than the first temperature, to connect an electrode of the electronic component structure and an electrode of the first electronic component, separating the mounting head from the first electronic component, and then fixing a second electronic component to the mounting head, arranging the second electronic component fixed to the mounting head, on the electronic component structure on a second stage portion, and heating the electronic component structure and the second electronic component by the first heater of the second stage portion and the second heater of the mounting head at the first temperature, and then cooling to the second temperature which is lower than the first temperature, to connect an electrode of the electronic component structure and an electrode of the second electronic component, in a state that a temperature of the first stage portion is set to the second temperature which is lower than the first temperature.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Embodiments will be explained with reference to the accompanying drawings hereinafter.

Prior to the explanation of embodiments, the preliminary matter to be set forth as a basis will be explained hereunder. In the preliminary matter, the problem caused in the case that a plurality of upper substrates are connected sequentially to a plane of a sheet of lower substrate by the soldering will be explained hereunder.

Figure 1A:
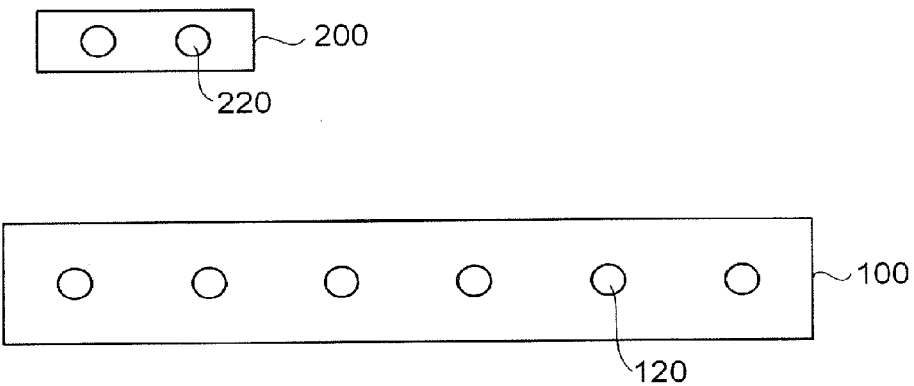
FIGS. 1A to 1C are sectional views (#1) depicting a method of manufacturing an electronic device according to the preliminary matter.

As depicted in FIG. 1A, an electronic component mounting device according to the preliminary matter includes a stage 100 and a mounting head 200. An electric heating wire 120 made of an iron-chromium-aluminum-based alloy, a nickel-chromium-based alloy, or the like is arranged in the stage 100 in the wound form, and a heat is generated by virtue of resistance heating by passing an electric current through the electric heating wire 120. By this matter, the whole of the stage 100 is heated integrally, and thus a work arranged on the stage 100 can be heated at a predetermined temperature.

Also, a similar electric heating wire 220 is provided in the mounting head 200, and thus a work to be sucked to the mounting head 200 can be heated at a predetermined temperature.

Figure 1B:
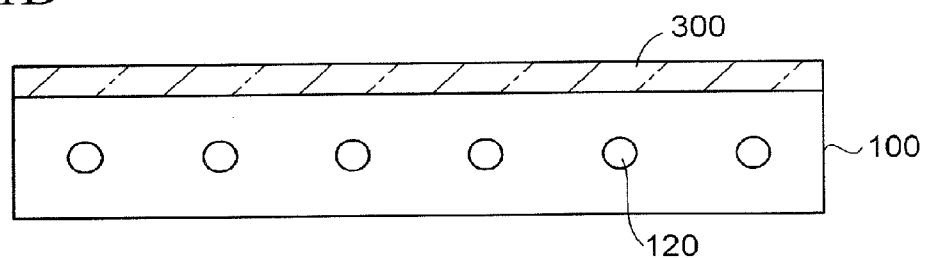

Then, as depicted in FIG. 1B, a lower substrate 300 is arranged on the stage 100, and then the lower substrate 300 is heated by passing an electric current through the electric heating wire 120. At this time, a heating temperature of the lower substrate 300 is set to 200° C. or less at which solder is not reflowed.

As described later, since a plurality of upper substrates are connected sequentially to a plane of the lower substrate 300 by the reflow soldering, this is because it prevents that the solder electrodes of the upper substrate which is already mounted are reflowed again.

Figure 1C:
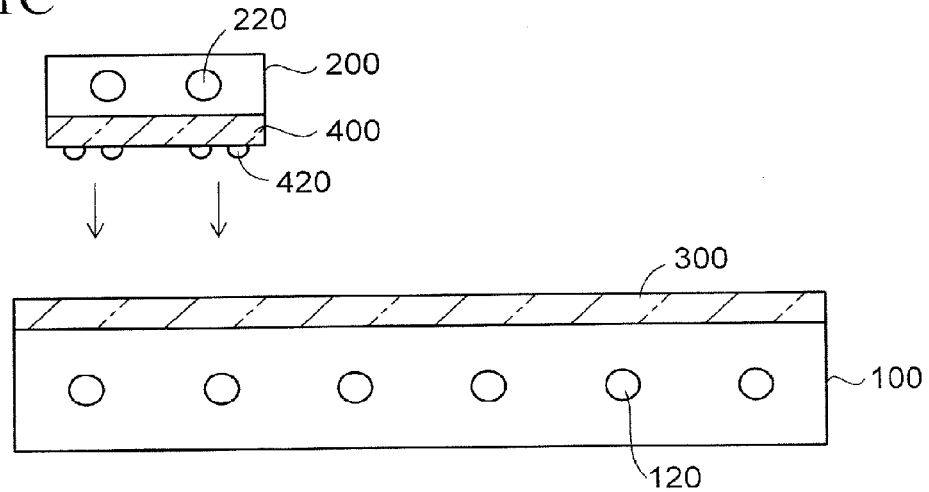

Then, as depicted in FIG. 1C, the other face of a first upper substrate 400 having solder electrodes 420 to one face thereof, is sucked to the mounting head 200. Then, flux (not shown) is coated onto the lower substrate 300, and also flux (not shown) is coated onto the solder electrodes 420 of the first upper substrate 400.

Figure 2A:
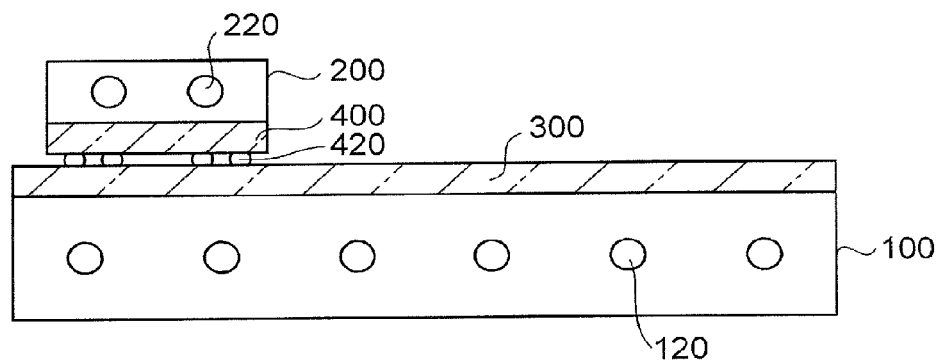
FIGS. 2A to 2C are sectional views (#2) depicting the method of manufacturing the electronic device according to the preliminary matter.

Subsequently, as depicted in FIG. 2A, the alignment is executed such that the solder electrodes 420 of the first upper substrate 400 are arranged on connection electrodes (not shown) of the lower substrate 300. Then, the mounting head 200 is arranged on the lower substrate 300 with applying a pressure.

Then, an electric current is passed through the electric heating wire 220 of the mounting head 200 to heat the first upper substrate 400 at about 280° C. Thus, the solder electrodes 420 of the first upper substrate 400 are reflowed.

After this, the electric current supplied to the electric heating wire 220 of the mounting head 200 is shut off. Then, the first upper substrate 400 is cooled until the temperature becomes 200° C. or less by a natural radiation in the state that the first upper substrate 400 is pressed by the mounting head 200.

By this matter, the first upper substrate 400 is electrically connected to connection electrodes (not shown) of the lower substrate 300 via the solder electrodes 420.

Figure 2B:
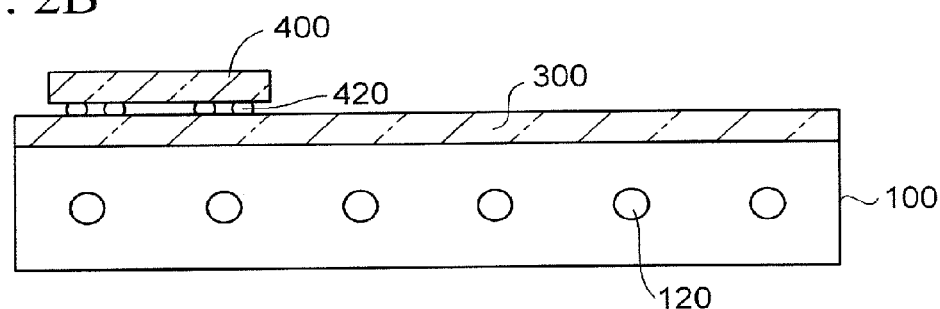
Figure 2C:
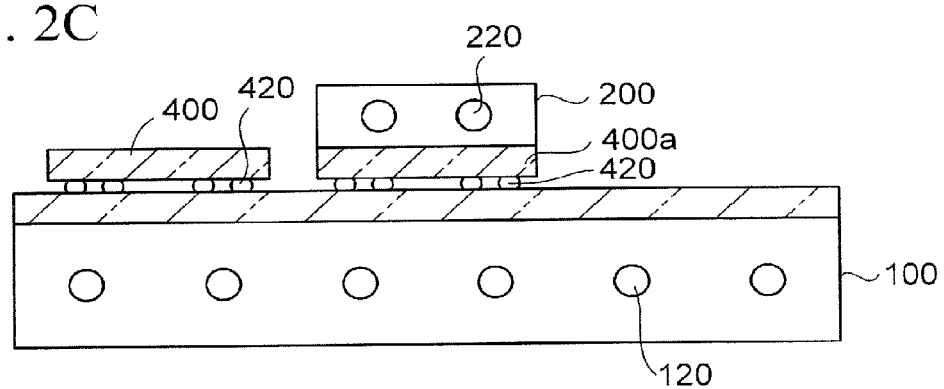

Then, as depicted in FIG. 2B, the mounting head 200 is lifted upward and is separated from the first upper substrate 400. Then, as depicted in FIG. 2C, according to the similar method, a second upper substrate 400a sucked to the mounting head 200 is arranged on the lower substrate 300, and then an electric current is passed through the electric heating wire 220 of the mounting head 200 to apply the reflow heating at a temperature of about 280° C. By this matter, the second upper substrate 400a is connected to connection electrodes (not shown) of the lower substrate 300 via the solder electrodes 420.

At this time, a temperature of the stage 100 is set to 200° C. or less so as to prevent the event that the solder electrodes 420 of the first upper substrate 400 which is already mounted are reflowed again. This is because in some cases separation may occur at the connection part if the solder electrodes 420 of the first upper substrate 400 which is already mounted are reflowed again, and thus sufficient reliability of the electrical connection cannot be obtained.

As described above, when the first and second upper substrates 400, 400a are connected to the lower substrate 300, a temperature of the lower substrate 300 is set to 200° C. or less whereas a temperature of the first upper substrate 400 is set to about 280° C.

Like this, at the time of the reflow heating, it is in a state that a considerable temperature difference is caused between the lower substrate 300 and the first and second upper substrates 400, 400a. Therefore, strong thermal stress is generated between the lower substrate 300 and the first and second upper substrates 400, 400a due to a difference of thermal expansion. As the result, such problems existed that warping of the substrate is ready to occur, and that sufficient reliability of the electrical connection cannot be obtained.

Also, in the mounting head 200, the heat is performed by passing continuously an electric current through the electric heating wire 220. Therefore, it takes much time when raising a temperature of the mounting head 200 up to a predetermined heating temperature and controlling a temperature. Also, since the first and second upper substrates 400, 400a are cooled by a natural radiation, it takes much time when curing the solder. As a result, such problems existed that tact times concerned with the manufacture are prolonged and thus production efficiency is low.

The above-mentioned failure can be solved by using the electronic component mounting device according to the embodiment explained hereunder.

Embodiment

FIG. 3A to FIG. 5 are views depicting an electronic component mounting device according to an embodiment, and FIG. 6 to FIG. 17C are sectional views depicting a method of manufacturing an electronic device according to the embodiment.

Figure 3A:
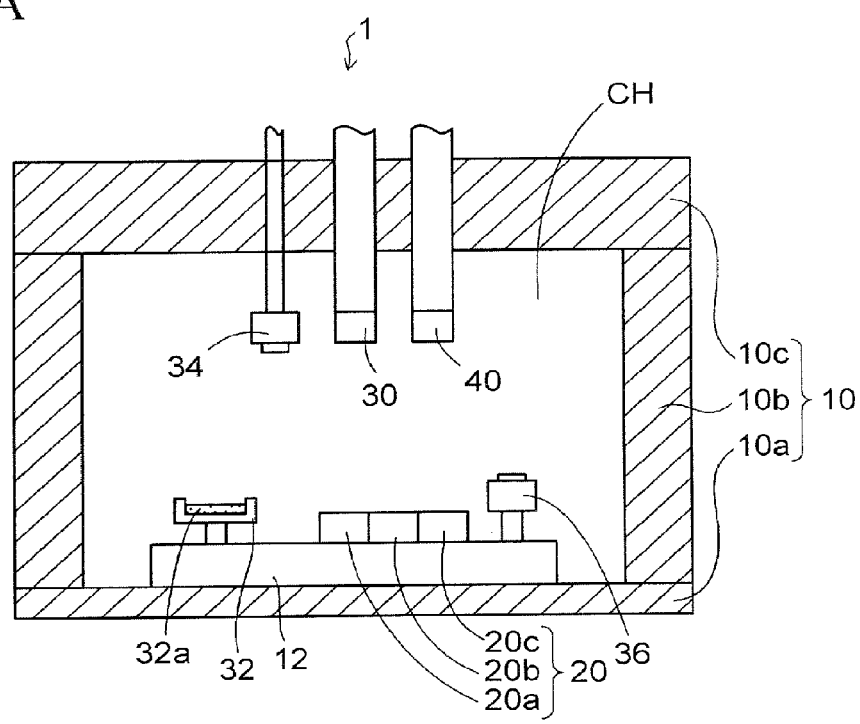
FIG. 3A is a sectional view depicting an electronic component mounting device according to an embodiment.

As depicted in a sectional view in FIG. 3A, an electronic component mounting device 1 of the embodiment includes a case 10 that contains a bottom case 10a, a sidewall case 10b, and a ceiling case 10c. Thus, a process chamber CH is formed by these cases.

Figure 3B:
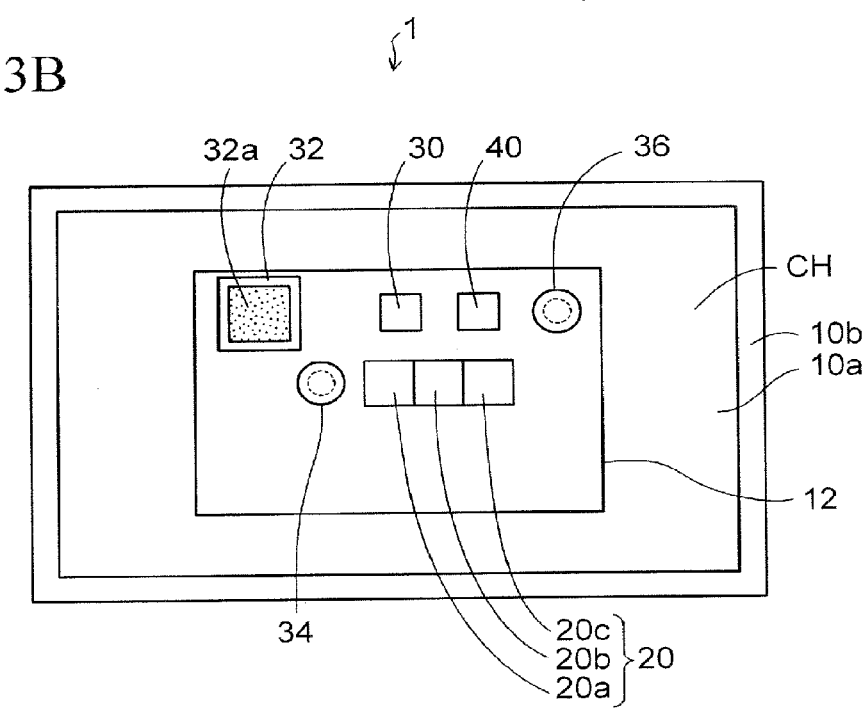
FIG. 3B is a plan view depicting the electronic component mounting device according to the embodiment.

By reference to a plan view of FIG. 3B together, a supporting member 12 is arranged on the bottom case 10a of the process chamber CH, and a stage 20 is provided on the supporting member 12. The stage 20 includes a stage portion 20a, a stage portion 20b, and a stage portion 20c.

The stage 20 including the stage portions 20a to 20c may be provided such that the stage 20 is divided every regions of the stage portions 20a to 20c, otherwise such that respective regions of the stage portions 20a to 20c are linked integrally. Any stage mode may be used if a plurality of stage portions can be defined on the stage 20. Also, the number of plural stage portions can be set arbitrarily. The stage 20 is connected to a drive unit (not shown), and can move in the horizontal direction on the supporting member 12.

Further, the electronic component mounting device 1 includes a flux transfer head 30 and a mounting head 40 to the ceiling case 10c. A large number of suction ports (not shown) for fixing a work by means of vacuum suction are formed at respective top end surfaces of the flux transfer head 30 and the mounting head 40. The flux transfer head 30 and the mounting head 40 are connected to a drive unit (not shown) respectively, and can move in the vertical direction.

Also, the electronic component mounting device 1 includes a flux table 32 into which flux 32a is put, over the supporting member 12 located to the side direction of the stage 20. The flux table 32 is connected to a drive unit (not shown), and can move over the supporting member 12 in the horizontal direction.

Moreover, the electronic component mounting device 1 includes an alignment camera 34 to the ceiling case 10c, and also includes an alignment camera 36 on the supporting member 12. A first alignment mark of the work which is arranged on the stage 20 is imaged by the alignment camera 34.

Also, A second alignment mark of the each work which is fixed to the flux transfer head 30 and the mounting head 40, is imaged by the alignment camera 36 respectively. The alignment camera 36 is connected to a drive unit (not shown), and can move over the supporting member 12 in the horizontal direction.

In this manner, the first alignment mark of the work arranged on the stage 20 and the second alignment mark of the work fixed to the flux transfer head 30 or the mounting head 40 are imaged respectively. Thus, alignment of the work is performed based on these images, thereby the coordinates of the stage 20 are decided.

Figure 4A:
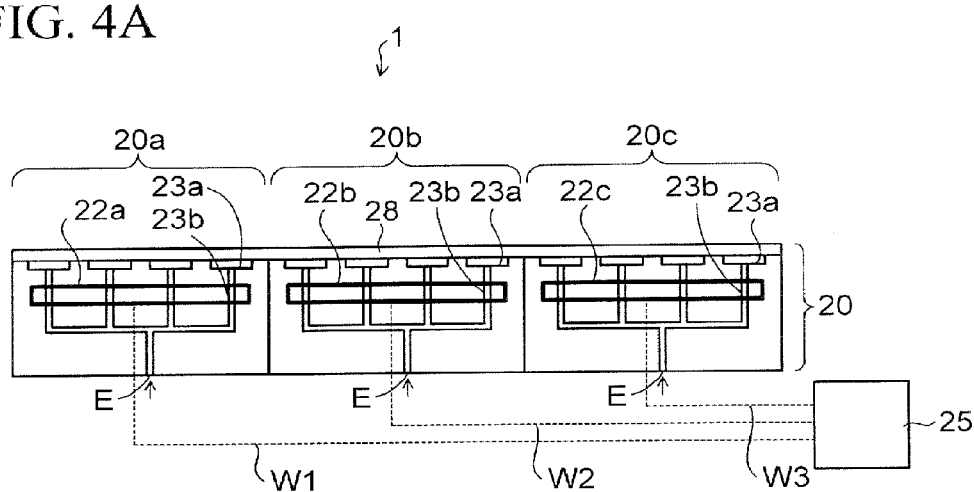
FIG. 4A is a sectional view depicting arrangement of a stage of the electronic component mounting device in FIG. 3A.

Next, the stage 20 and the mounting head 40 of the electronic component mounting device 1 in FIGS. 3A and 3B will be explained in more detail hereunder. In FIG. 4A, the stage 20 in FIG. 3A is depicted in an enlarged state. As depicted in FIG. 4A, a pulse heater 22a is provided in the stage portion 20a of the stage 20. Then, the pulse heater 22a is connected to a pulse power supply 25 by a wiring line W1.

Also similarly, a pulse heater 22b is provided in the stage portion 20b of the stage 20. Then, the pulse heater 22b is connected to the pulse power supply 25 by a wiring line W2. Further similarly, a pulse heater 22c is provided in the stage portion 20c of the stage 20. Then, the pulse heater 22c is connected to the pulse power supply 25 by a wiring line W3.

Figure 4B:
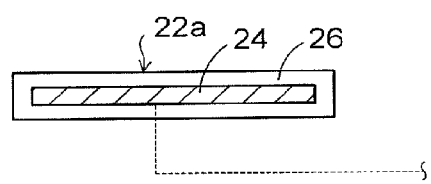
FIG. 4B is a sectional view depicting a pulse heater provided to the stage in FIG. 4A.

As depicted in FIG. 4B, the pulse heater 22a has such a structure that an electric heating plate 24 shaped like a flat plate is covered with a ceramic portion 26 whose thermal conductivity is high. The wiring line W1 is connected to the electric heating plate 24.

The electric heating plate 24 of the pulse heater 22a is formed of a metal such as tungsten, molybdenum, or the like, which has a high resistance value and generates easily a heat. Also, in the stage portions 20b, 20c, the pulse heaters 22b, 22c have the same structure as that of the pulse heater 22a respectively.

The pulse heaters 22a to 22c provided in the stage portions 20a to 20c can be controlled independently. By this matter, any one portion out of the stage portions 20a to 20c can be heated partially. Otherwise, it is of course that two or more out of the stage portions 20a to 20c can be heated simultaneously.

By applying the pulse current to the electric heating plate 24 from the pulse power supply 25, it is possible to rise the temperature quickly up to a set temperature, and a precise temperature control be enable.

In the example in FIG. 4A, one pulse heater 22a is provided in the stage portion 20a. In this case, a plurality of pulse heaters may be arranged in the area of the stage portion 20a in a state that those are separated.

By this matter, a desired area can also be heated partially in the planar area of the stage portion 20a. Similarly, in the stage portions 20b, 20c, the pulse heater may be arranged in a state that those are separated in the planar area thereof.

Also, a plurality of groove portions 23a are formed on the surface of the stage portion 20a, and an air supply route 23b is formed to be communicated with the bottom portions of the groove portions 23a respectively. An inlet E of the air supply route 23b is provided to the bottom surface of the stage portion 20a. The air supply route 23b is branched away from one inlet E.

Also in the stage portions 20b, 20c, like the stage portion 20a, the groove portions 23a and the air supply route 23b which is communicated with the bottom portions of these groove portions are formed.

Also, a heat transfer sheet 28 is formed on the stage portions 20a to 20c. As the heat transfer sheet 28, aluminum nitride (AlN) having high thermal conductivity, or the like is used.

Then, a cooling compressed air is supplied to the groove portions 23a through the air supply route 23b from the inlet E of the air supply route 23b on the bottom surface of the stage portion 20a. The work is cooled via the heat transfer sheet 28 by the compressed air which is supplied to the groove portions 23a. The cooling compressed air is released to the outside from a clearance between the surface of the stage portion 20a and the heat transfer sheet 28.

Like the above, in the electronic component mounting device 1 of the embodiment, the stage portions 20a to 20c includes the pulse heaters 22a to 22c independently respectively, and are capable of applying a quick temperature raising to the work.

Also, the stage portions 20a to 20c of the stage 20 includes the air supply routes 23b for supplying compressed air and cooling, and the groove portions 23a be communicated with the air supply route 23b independently respectively, and are capable of applying a quick cooling to the work.

For example, in the case that the temperature of the stage portion 20a is set to 100° C., then the temperature is raised up to 250° C., this temperature raising can be performed within almost 10 sec. On the contrary, in the case that the temperature of the stage portion 20a is fallen down from 250° C. to 100° C., this temperature falling can be performed within almost 20 sec.

Figure 5:
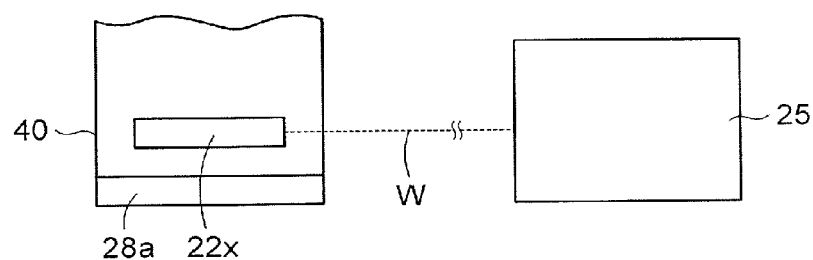
FIG. 5 is a sectional view depicting a structure of a mounting head of the electronic component mounting device in FIG. 3A.

In FIG. 5, the mounting head 40 in FIG. 3A is depicted in an enlarged fashion. As depicted in FIG. 5, a similar pulse heater 22x is provided in the mounting head 40, and this pulse heater 22x is connected to the pulse power supply 25 by a wiring line W. Also, a heat transfer sheet 28a made of AlN, or the like is formed on the top end surface of the mounting head 40.

Here, in the above flux transfer head 30, because no heat is applied to when the flux is transferred, there is no necessity to provide the pulse heater in the flux transfer head 30.

Next, a method of connecting a plurality of electronic components sequentially to the electronic component structure by the soldering, by means of using the electronic component mounting device 1 of the present embodiment, will be explained hereunder.

Figure 6:
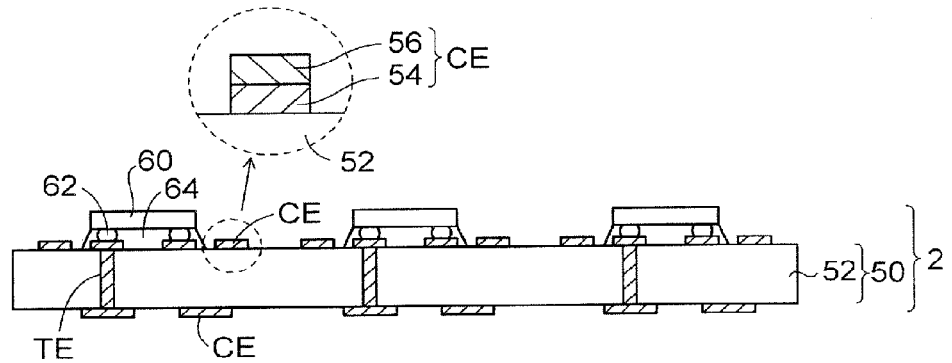
FIG. 6 is a sectional view (#1) depicting a method of manufacturing an electronic device component according to the embodiment.

As depicted in FIG. 6, first, an electronic component structure 2 is prepared. The electronic component structure 2 has such a structure that semiconductor chips 60 are mounted on a wiring substrate 50. In the wiring substrate 50, penetration electrodes TE are formed in an insulating substrate 52 so as to penetrate to the thickness direction thereof. The insulating substrate 52 may be formed of either a flexible substrate made of a polyimide film, etc. or a rigid substrate made of a glass epoxy resin, etc.

The wiring layers connected mutually via the penetration electrode TE are formed on both surface sides of the insulating substrate 52 respectively, and connection electrodes CE of the wiring layers are depicted. As one example of the connection electrode CE, as depicted in a fragmental enlarged sectional view in FIG. 6, a laminated structure in which a solder layer 56 is formed on a gold (Au) layer 54 by the plating is employed.

Then, bump electrodes 62 of the semiconductor chip 60 are flip-chip connected to the connection electrodes CE on the upper surface side of the wiring substrate 50. Then, an underfill resin 64 is filled into respective clearances formed under the semiconductor chips 60.

Figure 7:
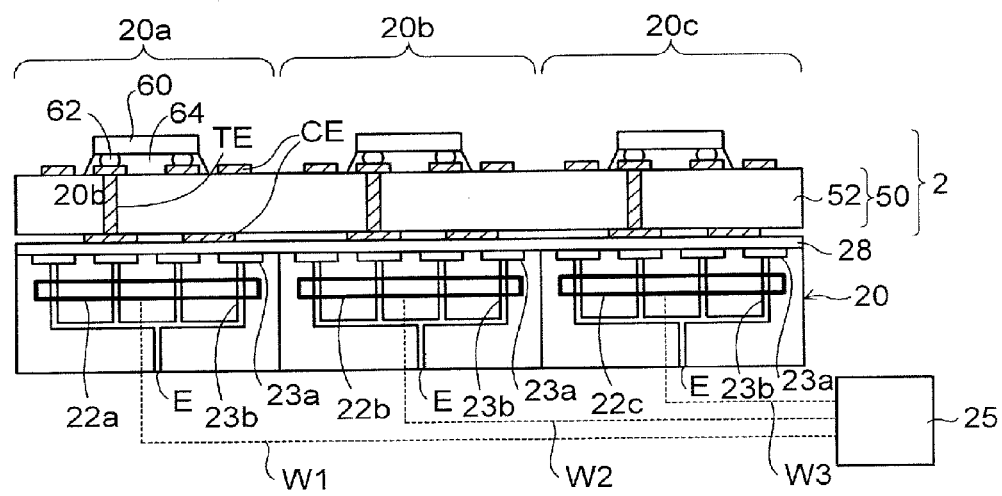
FIG. 7 is a sectional view (#2) depicting the method of manufacturing the electronic device according to the embodiment.

Then, as depicted in FIG. 7, the electronic component structure 2 in FIG. 6 is arranged on the heat transfer sheet 28 provided on the stage 20 of the above-mentioned electronic component mounting device 1. The electronic component structure 2 is arranged to extend over the stage portion 20a to 20c. At this time, the pulse heaters 22a to 22c of the stage portion 20a to 20c are set to a temperature at which the solder is not reflowed, e.g., about 100° C.

Figure 8:
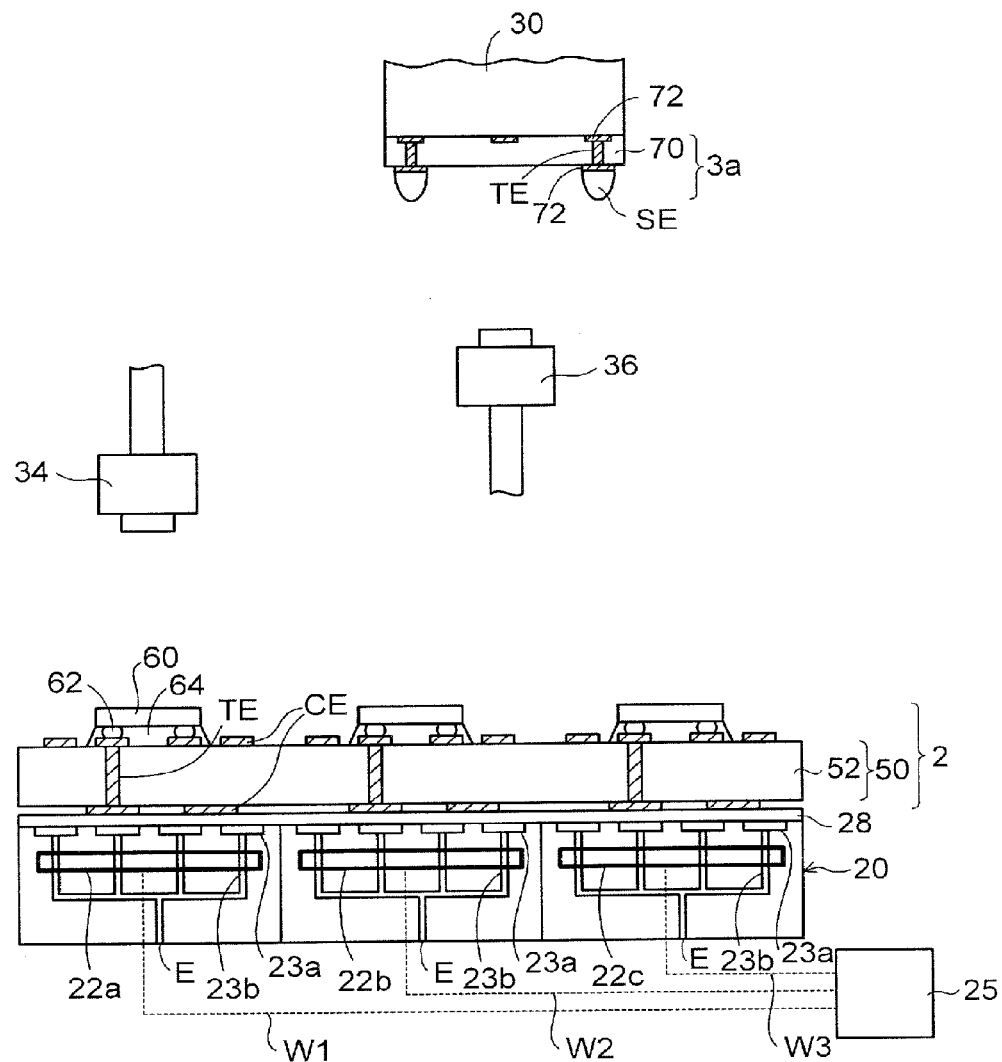
FIG. 8 is a sectional view (#3) depicting the method of manufacturing the electronic device according to the embodiment.

Subsequently, as depicted in FIG. 8, an electronic component 3a is fixed to the flux transfer head 30 of the electronic component mounting device 1 in FIG. 3A by means of the vacuum suction. In the electronic component 3a, wiring layers 72 which are formed on both surface sides of an insulating substrate 70 are mutually connected via the penetration electrode TE. Then, a solder electrode SE shaped like a bump is formed on connection parts of the wiring layers 72 on the lower surface side of the insulating substrate 70 respectively.

The face of the electronic component 3a, which is opposite to the face on which the solder electrodes SE are provided, is fixed onto the flux transfer head 30.

Then, the alignment for transferring the flux from the solder electrodes SE of the electronic component 3a to the connection electrodes CE of the electronic component structure 2, is performed. First, the alignment mark of the electronic component structure 2 on the stage portion 20a is imaged by the alignment camera 34 in FIG. 3A. Also, the alignment mark of the electronic component 3a fixed to the flux transfer head 30 is imaged by the alignment camera 36 in FIG. 3A.

Based on this, the aligned coordinates in the electronic component structure 2 and the electronic component 3a are detected. Then, the stage 20 is placed to the position indicated by this coordinates.

Figure 9A:
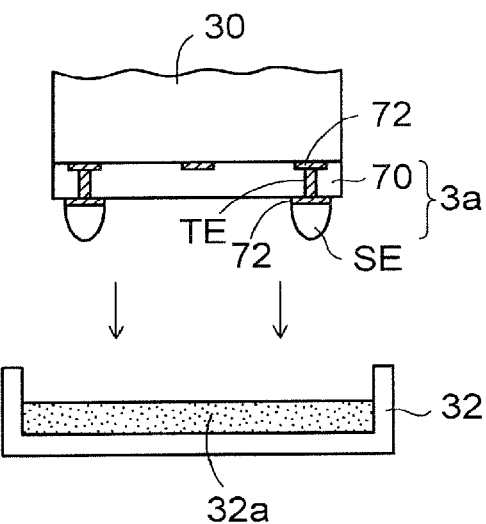
FIGS. 9A and 9B are sectional views (#4) depicting the method of manufacturing the electronic device according to the embodiment.
Figure 9B:
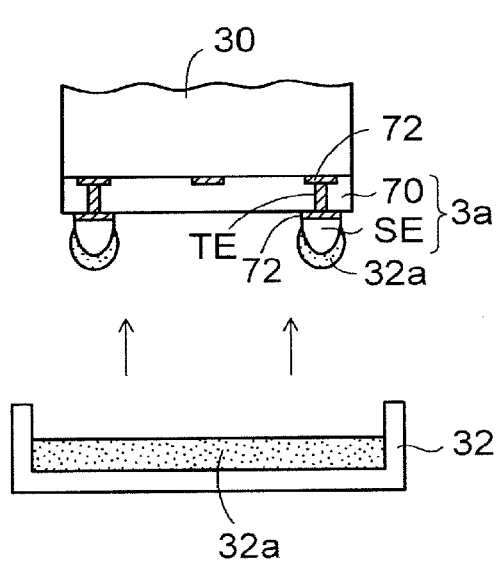

Then, as depicted in FIG. 9A, the flux table 32 in FIG. 3A is moved in the horizontal direction, and then the solder electrodes SE of the electronic component 3a fixed to the flux transfer head 30 are pushed against the flux 32a in the flux table 32. By this matter, as depicted in FIG. 9B, when the flux transfer head 30 is lifted up, the flux 32a is transferred onto the solder electrodes SE of the electronic component 3a.

Figure 10:
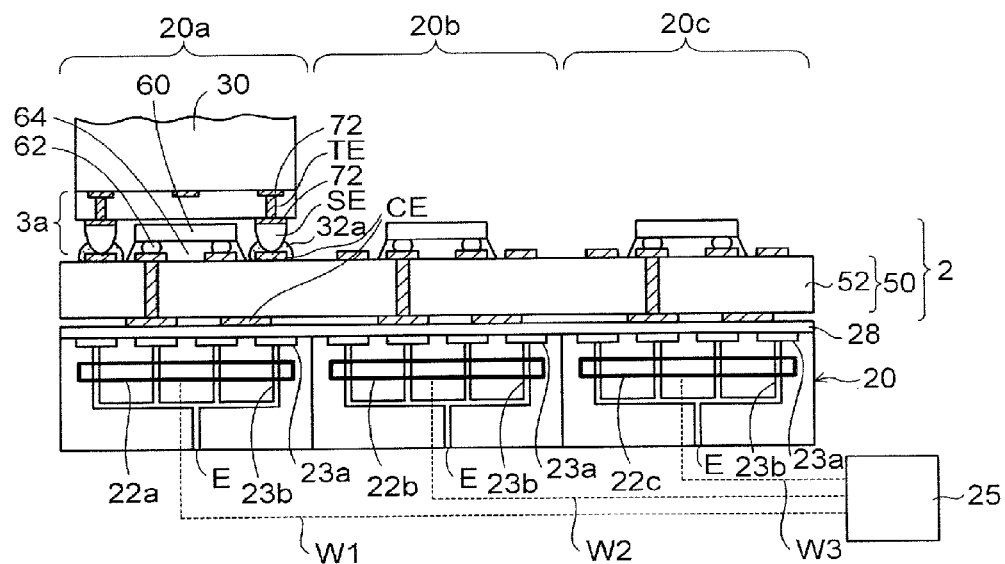
FIG. 10 is a sectional view (#5) depicting the method of manufacturing the electronic device according to the embodiment.

Then, as depicted in FIG. 10, the solder electrodes SE of the electronic component 3a fixed onto the flux transfer head 30 are arranged on the connection electrodes CE of the electronic component structure 2 on the stage portion 20a, with applying a pressure.

Figure 11:
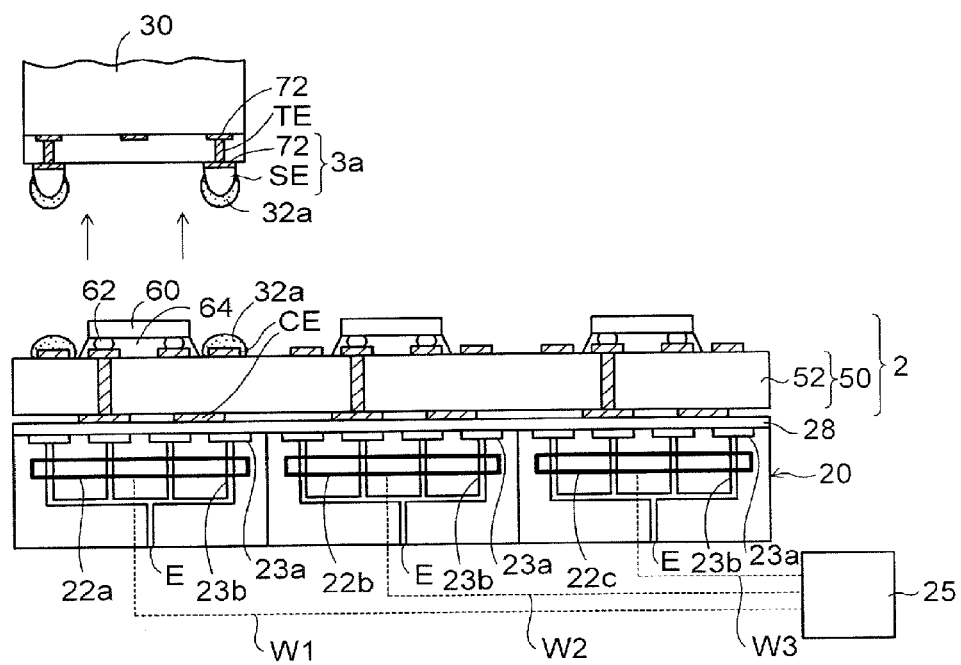
FIG. 11 is a sectional view (#6) depicting the method of manufacturing the electronic device according to the embodiment.

After this, as depicted in FIG. 11, when the flux transfer head 30 is lifted up, the flux 32a adhered to the solder electrodes SE of the electronic component 3a is transferred to the connection electrodes CE of the electronic component structure 2.

In this manner, the flux 32a is forced to adhere to the solder electrodes SE of the electronic component 3a and the connection electrodes CE of the electronic component structure 2.

The flux 32a has the property that it evaporates when this flux is heated at a temperature of about 120° C. to 150° C. As a consequence, in the present embodiment, by using the flux transfer head 30 having no heating means, the flux 32a never evaporates, and the flux 32a is made to adhere stably to both the solder electrodes SE of the electronic component 3a and the connection electrodes CE of the electronic component structure 2.

Here, the electronic component mounting device 1 does not necessarily have the flux transfer head 30. The flux can be formed by other methods such as the spray coating, or the like.

Figure 12:
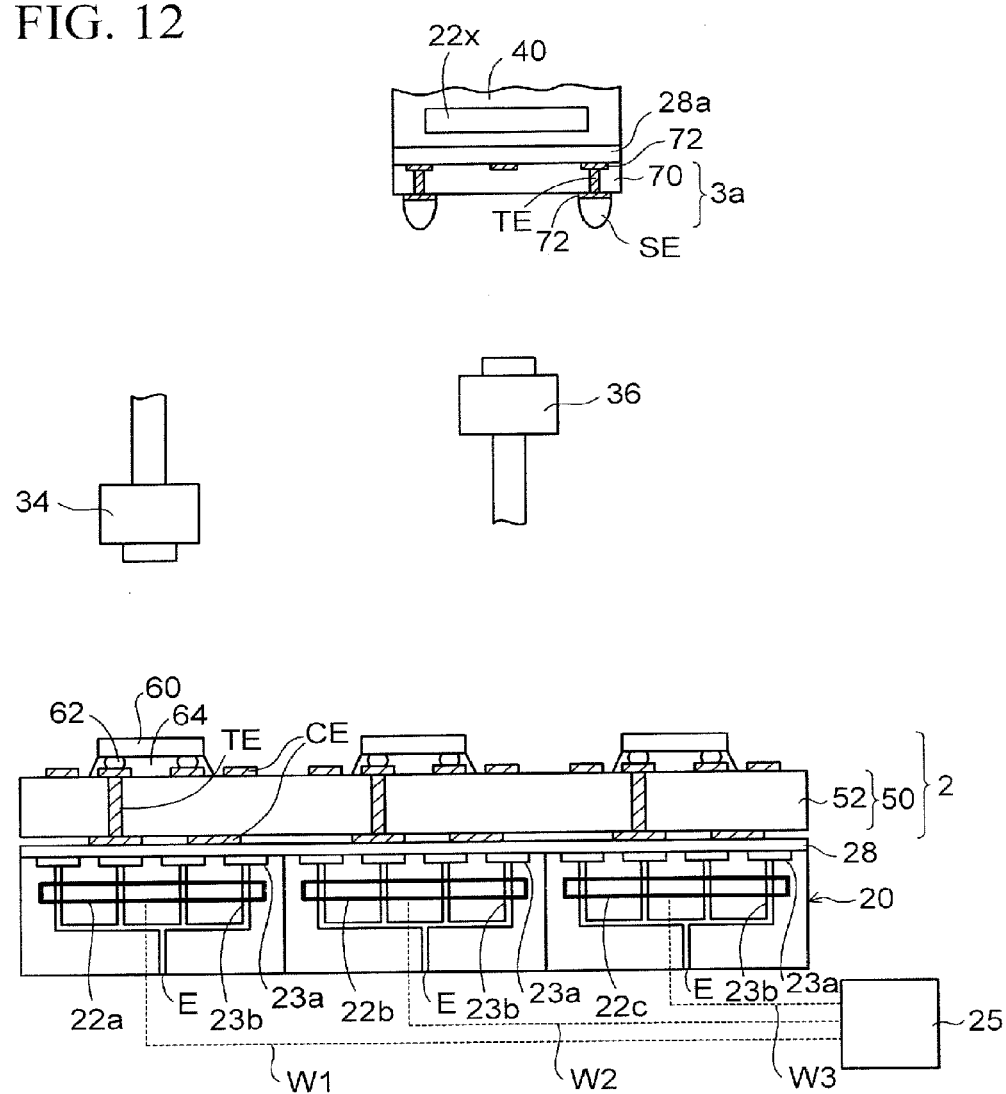
FIG. 12 is a sectional view (#7) depicting the method of manufacturing the electronic device according to the embodiment.

Then, as depicted in FIG. 12, the flux transfer head 30 is separated from the electronic component 3a, and then the electronic component 3a is fixed to the heat transfer sheet 28a of the mounting head 40 by means of the vacuum suction. At this point of time, a temperature of the pulse heater 22x of the mounting head 40 is set in advance to about 100° C. such that the flux 32a adhered to the solder electrodes SE of the electronic component 3a does not evaporate.

Further, the alignment for joining the electronic component structure 2 and the electronic component 3a is performed. The alignment mark of the electronic component structure 2 on the stage portion 20a is imaged by the alignment camera 34 in FIG. 3A. Also, the alignment mark of the electronic component 3a is imaged by the alignment camera 36 in FIG. 3A. Based on this, the stage 20 is placed in the position indicated with the aligned coordinates.

Figure 13:
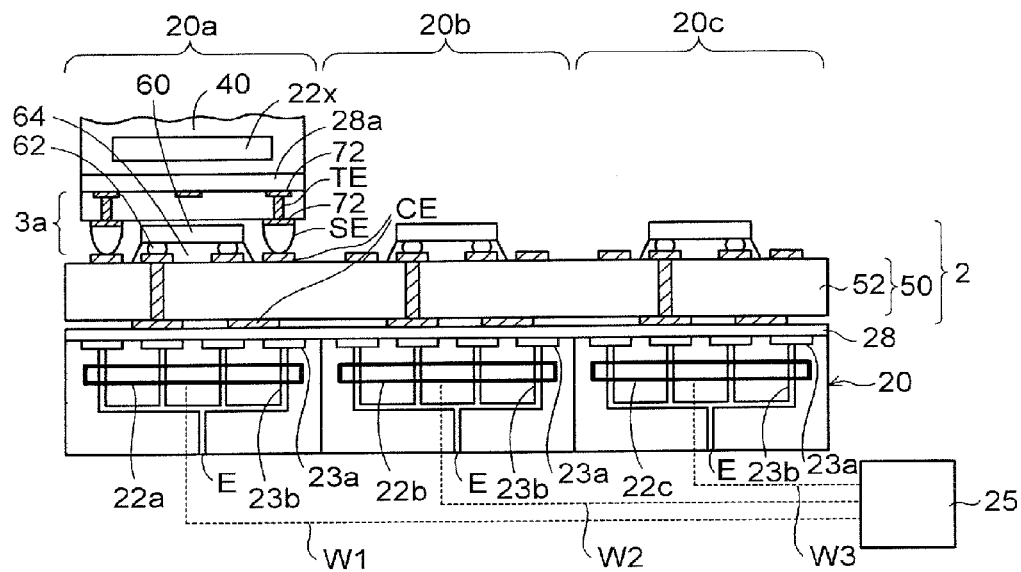
FIG. 13 is a sectional view (#8) depicting the method of manufacturing the electronic device according to the embodiment.

Then, as depicted in FIG. 13, the electronic component 3a fixed to the mounting head 40 is arranged on the electronic component structure 2 on the stage portion 20a, with applying a pressure. By this matter, the solder electrodes SE of the electronic component 3a are arranged on the connection electrode CE of the electronic component structure 2. Further, a temperature of the pulse heater 22x of the mounting head 40 is raised to about 250° C.

At the same time, a temperature of the pulse heater 22a of the stage portion 20a is raised from 100° C. to about 250° C. It is possible to raise the temperature quickly from 100° C. to 250° C. within about 10 sec by using the pulse heater.

In this way, the electronic component structure 2 on the stage portion 20a and the electronic component 3a are heated at the same reflow temperature. For explanatory convenience, a temperature raised when the solder is reflowed, e.g., about 250° C., is termed the first temperature.

Here, the reason why the reflow temperature in the present embodiment can be set lower than the reflow temperature in the method in the above-mentioned preliminary matter will be explained hereunder. For example, the reflow temperature in the method in the preliminary matter is set to 280° C., while a reflow temperature in the present embodiment is set to 250° C. that is lower than 280° C.

In the steps in FIG. 2A of the above preliminary matter, when the first upper substrate 400 fixed to the mounting head 200 is connected to the lower substrate 300 by the reflow heating, a temperature of the stage 100 is set to a temperature at which the solder is not reflowed again, e.g., less than 200° C. That is, a temperature of the stage 100 is set lower than a melting temperature of the solder electrodes 420 of the first upper substrate 400.

For this reason, the heat generated from the electric heating wire 220 of the mounting head 200 is absorbed to the stage 100 side. Therefore, it is necessary to set the set temperature of the mounting head 200 to a temperature that is redundantly higher than a melting temperature of the solder electrodes 420, e.g., 280° C.

On the contrary, in the electronic component mounting device 1 of the present embodiment in FIG. 4, the work can be heated from both the upper and lower sides at the same heating temperature by the pulse heater 22x of the mounting head 40 and the pulse heater 22a of the stage portion 20a.

Accordingly, when the electronic component 3a fixed to the mounting head 40 is connected to the electronic component structure 2 by the reflow heating, the absorption of the heat is not generated between the mounting head 40 and the stage portion 20a. Therefore, unlike the preliminary matter, there is no necessity to set the reflow temperature to the temperature that is redundantly higher than a melting temperature of the solder. By this matter, the electronic component 3a and the electronic component structure 2 can be connected by setting to the temperature near the melting temperature of the solder electrodes SE, e.g., the heating temperature of 250° C.

As a result, a heat load applied to the electronic components can be lessened rather than the method in the preliminary matter, and thus reliability of the electronic component can be improved. Also, the set temperature can be set lower than the method in the preliminary matter. Therefore, the temperature raising/temperature falling time can be shortened, and thus production capacity can be improved.

In this manner, the solder electrodes SE of the electronic component 3a and the solder layers 56 (FIG. 6) of the connection electrode CE of the electronic component structure 2 are reflowed. By using the flux transfer head 30, the flux 32a can be adhered stably to both the solder electrodes SE of the electronic component 3a and the connection electrode CE of the electronic component structure 2.

By this matter, not only the joining can be made easy by removing an oxide film generated on a surface of the joined metal, but also wettability of the solder to a surface of the joined metal can be promoted. As a result, the soldering can be handled stably.

Then, the electric current which is passed through both the pulse heater 22x of the mounting head 40 and the pulse heater 22a of the stage portion 20a is shut off. And, it is kept in such a state that the electronic component 3a is pushed by the mounting head 40.

Under this condition, the compressed air is supplied to the groove portions 23a from the inlet E of the air supply route 23b of the stage portion 20a, so that the electronic component structure 2 on the stage portion 20a is cooled to 100° C. or less via the heat transfer sheet 28. Since the electronic component structure 2 is cooled by the compressed air, the temperature can be quickly fallen from 250° C. to 100° C. within about 20 sec.

Here, for explanatory convenience, the temperature, e.g., 100° C., which is lower than the first temperature, e.g., 250° C. and at which the solder is not reflowed is termed the second temperature. When the stage portion 20a on which the reflow heating is applied is set to the first temperature, e.g., about 250° C., both the stage portion 20b and the stage portion 20c are set to the second temperature, e.g., about 100° C.

Figure 14:
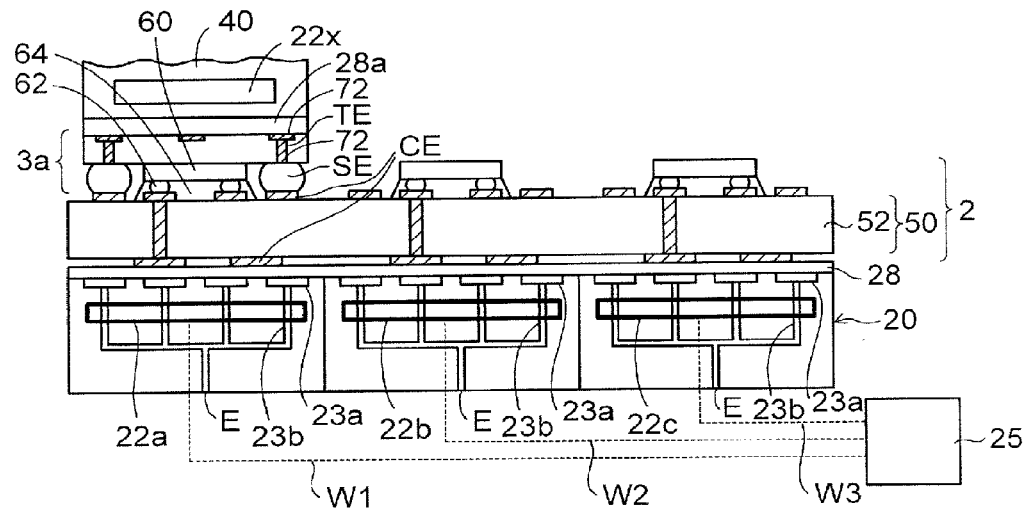
FIG. 14 is a sectional view (#9) depicting the method of manufacturing the electronic device according to the embodiment.

By this matter, as depicted in FIG. 14, the solder provided between the electronic component structure 2 and the electronic component 3a is cured. Thus, both components are electrically connected via the solder electrodes SE.

By doing like this, both the electronic component structure 2 and the electronic component 3a are heated by the same temperature at the time of reflow heating. Therefore, thermal stress is hard to occur due to a difference of thermal expansion, and thus it is prevented that warping of the electronic component structure 2 is generated. By this matter, the electronic component structure 2 and the electronic component 3a are electrically connected mutually with good reliability via the solder electrodes SE.

Also, the electronic component structure 2 is heated by the pulse heater 22a of the stage portion 20a and also the electronic component 3a is heated by the pulse heater 22x of the mounting head 40. Therefore, not only the temperature can be quickly raised, but also the control of the temperature can be performed with high precision.

Also, when the solder is cured by cooling the electronic component structure 2, the electronic component structure 2 can be quickly cooled by the compressed air.

With the above, times required at the time of temperature raising and temperature falling can be shortened. As a result, tact times concerned with the manufacture can be shortened, and thus production efficiency can be improved.

As the solder electrodes SE of the electronic component 3a, preferably the lead-free solder is used. Tin (Sn)-silver (Ag)-based solder, tin(Sn)-silver(Ag)-copper(Cu)-based solder, tin (Sn)-antimony (Sb)-based solder, or the like is used. For example, in the case that the solder electrodes SE are formed of the tin (Sn)-silver (Ag)-based solder, as the reflow temperature, it is set to the temperature that is higher than 221° C. which is the melting temperature of this solder, by about 20° C. to 50° C.

Here, as the preferred mode, the stage portions 20a to 20c include the pulse heaters 22a to 22c respectively. In this event, in the case that the production efficiency is not regarded as the importance, various heaters using the general electric heating wire, explained in the preliminary matter, can also be used.

Figure 15:
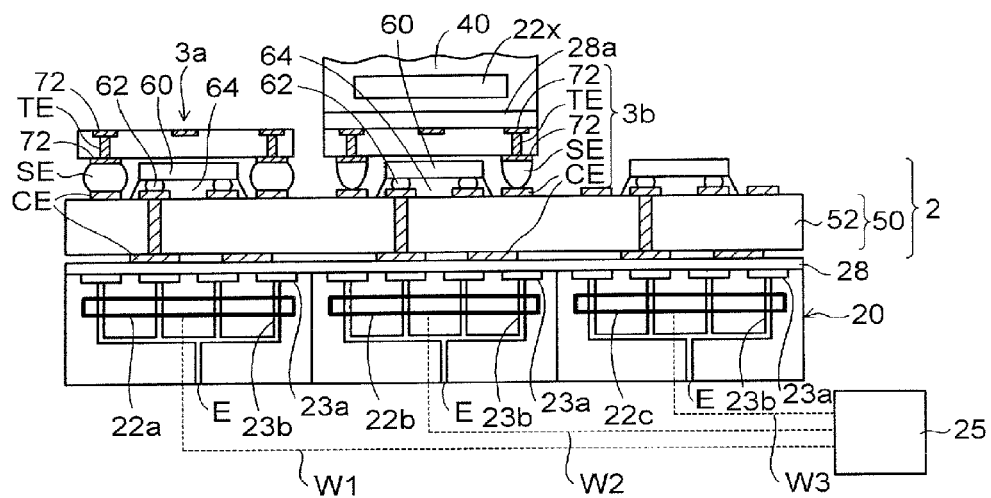
FIG. 15 is a sectional view (#10) depicting the method of manufacturing the electronic device according to the embodiment.

Then, as depicted in FIG. 15, according to the similar method, an electronic component 3h is fixed to the mounting head 40, and then is aligned to the electronic component structure 2 on the stage portion 20b. Then, the solder electrodes SF of the electronic component 3b fixed to the mounting head 40 are arranged on the connection electrodes CE of the electronic component structure 2 on the stage portion 20b.

Further, according to the similar method, a temperature of the pulse heater 22b of the stage portion 20b is raised from 100° C. to 250° C. At the same time, a temperature of the pulse heater 22x of the mounting head 40 is raised from 100° C. to 250° C. By this matter, both the solder electrodes SE of the electronic component 3b and the solder layers 56 (FIG. 6) of the connection electrodes CE of the electronic component structure 2 are reflowed.

As described above, the pulse heaters 22a to 22c of the stage portions 20a to 20c can be controlled independently. Therefore, when the electronic component 3b is mounted, only a temperature of the pulse heater 22b of the stage portion 20b can be raised up to 250° C., but it can be in a state that respective temperatures of the stage portion 20a and the stage portion 20c are set to 100° C.

By this matter, when the reflow heating is applied to the electronic component structure 2 and the electronic component 3b on the stage portion 20b, it can be avoided that the solder electrodes SE of the electronic component 3a which is already mounted are reflowed again. As a result, reliability of the electrical connection between the electronic component 3a and the electronic component structure 2 can be ensured.

Moreover, according to the similar method, the electronic component structure 2 on the stage portion 20b is cooled to about 100° C. by the compressed air.

Figure 16:
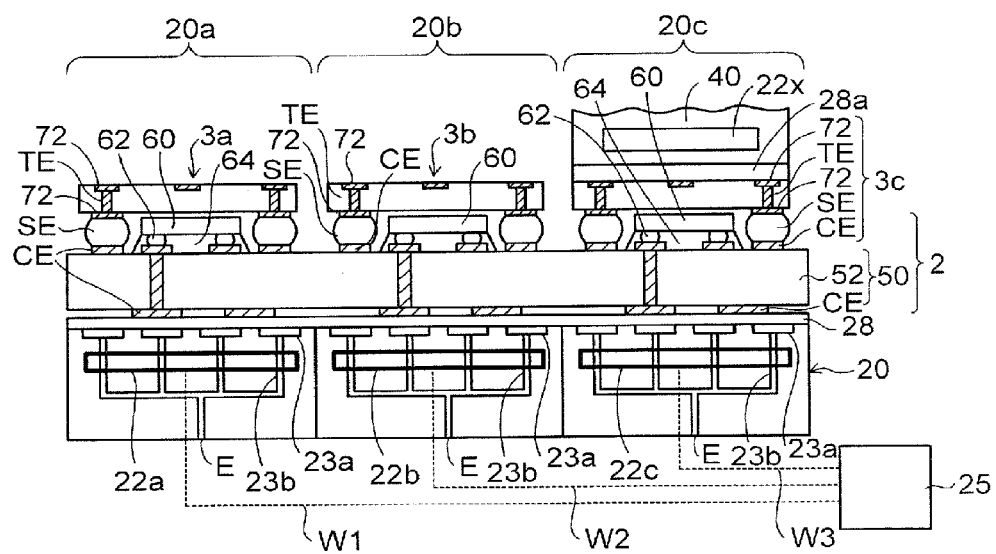
FIG. 16 is a sectional view (#11) depicting the method of manufacturing the electronic device according to the embodiment.

By this matter, as depicted in FIG. 16, the solder provided between the electronic component structure 2 and the electronic component 3b is cured. Thus, both electronic components are electrically connected via the solder electrodes SE.

Then, similarly as depicted in FIG. 16, according to the similar method, the electronic component 3c is fixed to the mounting head 40, and the alignment is performed, then, the solder electrodes SE of the electronic component 3c are arranged on the connection electrodes CE of the electronic component structure 2 on the stage portion 20c.

Further, according to the similar method, a temperature of the pulse heater 22c of the stage portion 20c is raised from 100° C. to 250° C. At the same time, a temperature of the pulse heater 22x of the mounting head 40 is also raised from 100° C. to 250° C.

By this matter, the solder electrodes SE of the electronic component 3c and the solder layers 56 (FIG. 6) of the connection electrodes CE of the electronic component structure 2 are reflowed.

Further, according to the similar method, the electronic component structure 2 on the stage portion 20c is cooled such that the temperature becomes 100° C. or less by the compressed air.

By this matter, the solder provided between the electronic component structure 2 and the electronic component 3c is cured. Thus, both electronic components are electrically connected via the solder electrodes SE.

When the electronic component 3c is mounted as well, only the stage portion 20c is heated to 250° C. by the pulse heater 22c, whereas it can be in a state that respective temperatures of the stage portions 20a, 20b are set to 100° C. Accordingly, when the reflow heating is applied to the electronic component 3c, it can be avoided that the solder electrodes SE of the electronic components 3a, 3b which are already mounted are reflowed again.

Figure 17A:
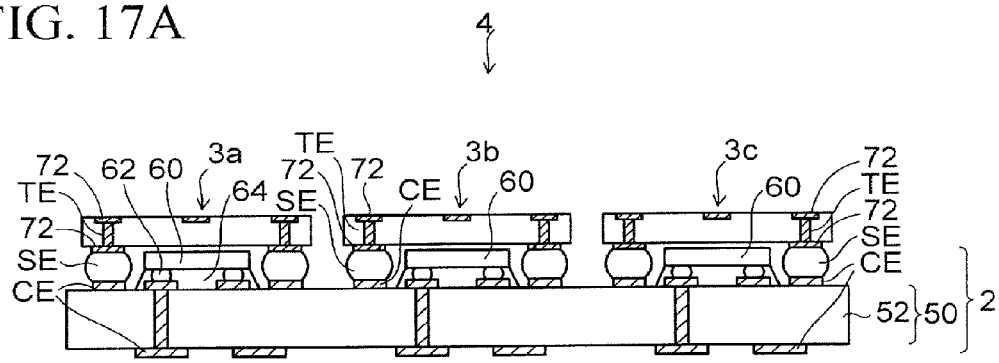
FIGS. 17A to 17C are sectional views (#12) depicting the method of manufacturing the electronic device according to the embodiment.

After this, as depicted in FIG. 17A, the mounting head 40 is separated from the electronic component 3c, and then a stacked electronic member 4 in which the electronic components 3a to 3c are stacked on the electronic component structure 2 is carried from the electronic component mounting device 1 to the outside.

Figure 17B:
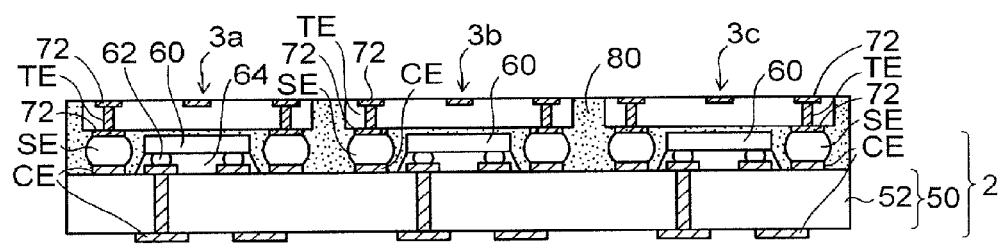

Then, as depicted in FIG. 17B, a sealing resin 80 is filled into respective clearances between the electronic component structure 2 and the electronic components 3a to 3c, and clearances between lateral direction of the electronic components 3a to 3c.

Figure 17C:
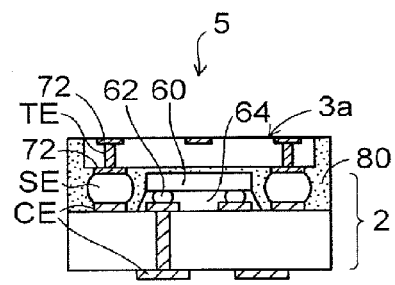

Then, as depicted in FIG. 17C, respective regions between the electronic components 3a to 3c of the stacked electronic member 4 in FIG. 17B are cut from an upper surface of the sealing resin 80 to the electronic component structure 2. The upper surface of the sealing resin 80 is a face opposite to a face which contacts the wiring substrate 52. Thus, individual stacked electronic devices 5 are obtained. Another electronic component may be further stacked on the electronic component 3a of the stacked electronic device 5.

As explained above, by using the electronic component mounting device 1 of the present embodiment, respective temperatures of the stage portions 20a to 20c can be controlled independently. Accordingly, the reflow heating can be applied to the electronic component 3b in a state that the temperature of the electronic component 3a which is already mounted is fallen to the temperature at which the solder is not reflowed.

Accordingly, not only the mounting head 40 but also the stage portion 20b can be set to the temperature of the reflow heating. By this matter, the electronic component structure 2 and the electronic component 3b can be connected mutually by applying the reflow heating at the same temperature.

From the above, a temperature difference caused at the time of respective mounting can be eliminated between the electronic component structure 2 and the electronic components 3a to 3c. Thereby, thermal stress due to the difference of thermal expansion is hard to occur, and thus it can be prevented that warping of the substrate occurs. By this matter, the electronic component structure 2 and the electronic components 3a to 3c are electrically connected mutually with good reliability.

Also, the stage portions 20a to 20c and the mounting head 40 are heated by the pulse heater respectively, thereby the temperature can be quickly raised and the temperature can be controlled with high precision. Also, when the stage portions 20a to 20c are cooled, those can be quickly cooled by the compressed air.

By this matter, since times when raising the temperature and falling the temperature can be shortened, the tact times concerned with the manufacture can be shortened, and production efficiency can be improved.

Also, by using the flux transfer head 30 at a normal temperature, the flux is adhered onto the electronic components. 3a to 3c and the electronic component structure 2. Whereby, evaporation of the flux can be prevented, and the flux can be formed stably.

(Other Modes)

In the above embodiment, the mode in which the solder electrodes SE of the electronic components 3a to 3c are connected in sequence to the connection electrodes CE of the electronic component structure 2 by the solder joining, is explained. Besides this mode, out of the electrode of the electronic component structure and the electrode of the electronic component, one electrode may be formed of a gold (Au) electrode and the other electrode may be formed of an indium (In) electrode.

In this case, by reflowing the indium electrodes at 480° C. to 500° C., the electronic component structure and the electronic component are connected by means of the Au—In joining.

Similarly in this case, when the electronic component is mounted on the stage portion, the temperature of the stage portion on which the electronic component is already mounted can also be set to the temperature at which the indium electrodes are not reflowed. By this matter, such a situation can be avoided that the indium electrodes of the electronic component which is already mounted are reflowed again.

Also, in the above embodiment, the wiring substrate on which the semiconductor chip is mounted is illustrated as the electronic component structure, and the wiring substrate is illustrated as the electronic component which is mounted thereon. Besides this mode, various components can be used as the electronic component structure and the electronic component.

For example, the semiconductor wafer such as the silicon wafer on which various elements are formed, and the like may be used as the electronic component structure, and the semiconductor chip or the wiring substrate may be mounted as the electronic component thereon. In this event, the semiconductor wafer is cut individually finally, thus the stacked semiconductor devices are obtained.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. A method of manufacturing an electronic device, comprising steps of:
    providing an electronic component mounting device which includes:
        a stage arranged in a process chamber, the stage including:
            a plurality of stage portions which are defined in the stage,
            a groove portion formed on a surface of the stage portions,
            an air supply route which is communicated with a bottom part of the groove portion;
            wherein groove portion and the air supply route are provided independently in the stage portion respectively, and
            a first pulse heater provided as individual heaters in the plurality of stage portions respectively, and wherein heating of each of the first pulse heater can be controlled independently;
        a mounting head arranged over the stage in the process chamber, the mounting head being provided with in a second pulse heater;
        a flux transfer head for transferring flux to an electronic component, the flux transfer head arranged over the stage in the process chamber;
        a flux table into which flux is put, the flux table arranged in the process chamber;
        a first alignment camera imaging an alignment mark of an electronic component structure which is to be arranged on the stage; and
        a second alignment camera imaging an alignment mark of the electronic component fixed to the mounting head or the flux transfer head;
    arranging an electronic component structure on the stage;
    transferring the flux onto a solder electrode of a first electronic component which is disposed on a first stage portion in the plurality of stage portions, by pushing the solder electrode of the first electronic component fixed to the flux transfer head against the flux in the flux table;
    transferring the flux onto an electrode of the electronic component structure which is disposed on a first stage portion in the plurality of the stage portions, by pushing the flux of the solder electrode of the first electronic component fixed to the flux transfer head against the electrode of the electronic component structure;
    separating the first electronic component from the flux transfer head, and then fixing the first electronic component to the mounting head;
    imaging the alignment mark of the electronic component structure which is disposed on the first stage portion and the alignment mark of the first electronic component, by the first alignment camera and the second alignment camera, thereby the alignment between the electronic component structure and the first electronic component is performed;
    arranging the first electronic component fixed to the mounting head, on the electrode of the electronic component structure, by pushing the solder electrode of the first electronic component fixed to the mounting head, on the flux of the electrode of the electronic component structure which is disposed on the first stage portion;
    heating the electronic component structure which is disposed on the first stage portion and the first electronic component, by the first heater of the first stage portion and the second heater of the mounting head at a first temperature which is a reflow temperature of the solder;
    cooling to a second temperature which is lower than the first temperature, to connect the electrode of the electronic component structure which is disposed on the first stage portion and the electrode of the first electronic component;
    separating the mounting head from the first electronic component, and then fixing a second electronic component to the flux transfer head;
    transferring the flux onto a solder electrode of the second electronic component, by pushing the solder electrode of the second electronic component fix to the flux transfer head against the flux in the flux table;
    transferring the flux onto an electronic component structure which is disposed on a second stage portion in the plurality of stage portions, by pushing the flux of the solder electrode of the second electronic component fixed to the flux transfer head against the electrode of the electronic component structure;

separating the second electronic component from the flux transfer head, and then fixing the second electrode component to the mounting head;
imaging the alignment mark of the electronic component structure which is disposed on the second stage portion and the alignment mark of the second electronic component by the first alignment camera and the second alignment camera, thereby the alignment between the electronic component structure and the second electronic component is performed;
arranging the second electronic component fixed to the mounting head, on the electrode of the electronic component structure, by pushing the second electronic component fixed to the mounting head on the flux of the electrode of the electronic component structure which is disposed on the second stage portion; and
heating the electronic component structure which is disposed on the second stage portion and the second electronic component by the first heater of the second stage portion and the second heater of the mounting head at the first temperature, in a state that a temperature of the first stage portion is set to the second temperature which is lower than the first temperature which a reflow temperature of the solder;
cooling to the second temperature which is lower than the first temperature, to connect an electrode of the electronic component structure which is disposed on the second stage portion and the solder electrode of the second electronic component, subsequently after heating the electronic component structure which is disposed on the second stage portion and the second electronic component.

* * * * *